(12) United States Patent
Wu et al.

(10) Patent No.: US 11,109,502 B2
(45) Date of Patent: Aug. 31, 2021

(54) CONNECTOR ASSEMBLY WITH RETAINER FOR CPU

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Heng-Kang Wu, Kunshan (CN); Fu-Jin Peng, Kunshan (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/846,402

(22) Filed: Apr. 13, 2020

(65) Prior Publication Data

US 2020/0329578 A1    Oct. 15, 2020

(30) Foreign Application Priority Data

Apr. 12, 2019  (CN) .......................... 201910291630.1

(51) Int. Cl.
| | |
|---|---|
| H01R 12/00 | (2006.01) |
| H05K 7/10 | (2006.01) |
| H05K 1/18 | (2006.01) |
| H01R 12/70 | (2011.01) |
| H01R 13/502 | (2006.01) |
| H01R 13/639 | (2006.01) |

(52) U.S. Cl.
CPC ........... *H05K 7/10* (2013.01); *H01R 12/7058* (2013.01); *H01R 12/7076* (2013.01); *H01R 13/502* (2013.01); *H01R 13/639* (2013.01); *H05K 1/181* (2013.01); *H05K 2201/10424* (2013.01)

(58) Field of Classification Search
CPC ... H05K 7/10; H01R 12/7058; H01R 12/7076
USPC .................................................... 439/71, 526
See application file for complete search history.

(56) References Cited

U.S. PATENT DOCUMENTS

| | | | | |
|---|---|---|---|---|
| 4,715,835 A | * | 12/1987 | Matsuoka ............ | H05K 7/1023 206/724 |
| 4,767,984 A | * | 8/1988 | Bakker ................ | H05K 7/1023 206/724 |
| 4,832,612 A | * | 5/1989 | Grabbe ............... | H01L 23/4985 206/722 |

(Continued)

FOREIGN PATENT DOCUMENTS

CN          206685589 U       11/2017

*Primary Examiner* — Neil Abrams
(74) *Attorney, Agent, or Firm* — Ming Chieh Chang; Wei Te Chung (57) ABSTRACT

An electrical connector assembly includes an insulative housing, a plurality of contacts retained to the housing, a metallic frame/fastener surrounding the housing, a retainer/clip positioned upon the housing and retaining a CPU thereon. The metallic frame includes four positioning posts at four corners, and the retainer includes a frame part to form a receiving space for receiving the CPU therein, and further includes four metallic retaining supports embedded within four corners of the retainer corresponding to the four positioning posts so as to allow the four positioning posts to extending therethrough in the vertical direction.

20 Claims, 10 Drawing Sheets

(56) References Cited

U.S. PATENT DOCUMENTS

| | | | | |
|---|---|---|---|---|
| 5,301,416 A * | 4/1994 | Foerstel | ............... | H05K 7/1023 |
| | | | | 29/593 |
| 5,589,781 A * | 12/1996 | Higgins | ............. | G01R 1/07342 |
| | | | | 324/750.25 |
| 5,885,101 A * | 3/1999 | Matsuoka | ............... | H01L 23/32 |
| | | | | 439/526 |
| 5,971,156 A * | 10/1999 | Slocum | ............. | H01L 21/67333 |
| | | | | 206/560 |
| 6,579,120 B2 * | 6/2003 | Abbott | ................. | H05K 7/1007 |
| | | | | 439/526 |
| 7,056,130 B1 * | 6/2006 | McAlonis | ............ | H05K 7/1061 |
| | | | | 439/526 |
| 7,257,004 B2 * | 8/2007 | Costello | ................. | H05K 1/141 |
| | | | | 174/16.3 |
| 7,534,133 B2 * | 5/2009 | Hamner | ............... | H05K 7/1084 |
| | | | | 439/526 |
| 7,682,160 B2 * | 3/2010 | Liao | ..................... | H05K 7/1069 |
| | | | | 439/71 |
| 7,837,478 B2 * | 11/2010 | Fan | ...................... | H05K 7/1053 |
| | | | | 439/71 |
| 7,884,630 B2 * | 2/2011 | Osato | .................... | G01R 1/0483 |
| | | | | 324/756.02 |
| 8,905,794 B2 * | 12/2014 | Chawla | ................. | H01R 12/71 |
| | | | | 439/682 |
| 9,590,332 B2 * | 3/2017 | Peng | ................. | H01R 12/7076 |
| 10,276,473 B2 | 4/2019 | Fit | | |
| 10,411,390 B2 * | 9/2019 | Wu | ...................... | H01R 13/447 |
| 10,651,106 B2 * | 5/2020 | Wu | ...................... | H01R 12/7076 |
| 10,861,771 B2 * | 12/2020 | Wu | ......................... | H01L 23/32 |
| 10,903,591 B2 * | 1/2021 | Zhang | ................... | H01R 13/40 |

* cited by examiner

CONNECTOR ASSEMBLY WITH RETAINER FOR CPU

BACKGROUND OF THE INVENTION

1. Field of the Invention

The present invention relates to a connector assembly, and particularly to a connector assembly equipped with a retainer for holding a CPU (Central Processing Unit) or a dust cover thereto.

2. Description of Related Arts

U.S. Pat. No. 10,276,473 discloses the electrical connector assembly equipped with a retainer/clip to holing the CPU in the connector. Anyhow, the retainer is made of plastic, thus tending to be relatively fragile and broken at four corners where the metallic positioning posts extend therethrough in the vertical direction.

Therefore, an improvement to the retainer to endure engagement with the positioning posts at the four corners, is desired.

SUMMARY OF THE INVENTION

To achieve the above object, an electrical connector assembly includes an insulative housing, a plurality of contacts retained to the housing, a metallic frame/fastener surrounding the housing, a retainer/clip positioned upon the housing and retaining a CPU thereon. The metallic frame includes four positioning posts at four corners, and the retainer includes a frame part to form a receiving space for receiving the CPU therein, and further includes four metallic retaining supports embedded within four corners of the retainer corresponding to the four positioning posts so as to allow the four positioning posts to extending therethrough in the vertical direction.

Other advantages and novel features of the invention will become more apparent from the following detailed description of the present embodiment when taken in conjunction with the accompanying drawings.

DETAILED DESCRIPTION OF THE PREFERRED EMBODIMENT

Referring to FIGS. 1-10, an electrical connector assembly 100 positioned upon the printed circuit board 300 for mounting a CPU or electronic package 200, includes an insulative housing 1, a plurality of contacts 2 retained to in the housing 1, a metallic frame/fastener 3 surrounding the housing 1, and an insulative retainer 4 retainably positioned upon the housing 1 for holding the CPU 200 therein. The frame 3 includes four positioning posts 30 at four corners. The retainer 4 includes a frame part 41 with a receiving space 40 therein for receiving the CPU 200. Four metallic retaining supports 420 are integrally formed at four corners of the frame part 41 via an insert-molding process. Each retaining support 42 forms a through hole 420 to receive the corresponding positioning post 30.

The retaining support 42 includes a ring 421 to form the through hole 420, and an extension 422 extending from the ring 420 to a center of the receiving space 40. The extension 422 extends in a horizontal direction perpendicular to an axial direction of the through hole 420. In this embodiment, the through hole 420 and the positioning post 30 are both round for compliance with each other. The ring 420 is exposed to an exterior in the vertical direction both upwardly and downwardly while the extension 422 is exposed to the exterior upwardly only. In this embodiment, the material of the retaining support 42 is stainless.

The extension 422 of the retainer 4 forms a downward/offset rim 4220, with a through hole (not labeled) therein, embedded within the frame part 41 for enhancing retention between the retaining support 42 and the frame part 41. The extension 422 further includes a pair of sidewardly extending bulged sections 4221 having less thickness than the extension 422 so as to be embedded/hidden within the frame part 41 both upwardly and downwardly. In this embodiment, the bulged sections 4221 are offset from each other along the extension direction of the extension 422. In this embodiment, the ring 421 and the extension 422 are coplanar with each other.

The frame part 41 includes a pair of first sides 411 and a pair of second sides 412. The retaining support 42 is located at the corner and the extension 422 extends in an oblique direction toward a center region of the receiving space 40. The first side 411 forms the latch 4111 with a hook 4112 at the free end wherein the hook forms a guiding surface 412. The first side 411 further includes a positioning block 4114. The CPU 200 includes a plate 201 and the raised portion 202 with a pair of notches 203. During assembling, the hook 4112 is located under the plate 201 and the positioning block 4114 is received within the notch 203. The housing 10 forms a plurality of L-shaped upstanding walls 11, and the frame part 41 forms corresponding alignment grooves 413 to receive the upstanding walls 11 so as to align the retainer 4 with the housing 10 in the vertical direction. The frame part 41 further includes four retaining posts 414 for engagement with a heatsink (not shown) which is located upon the CPU 200.

Figure 1:
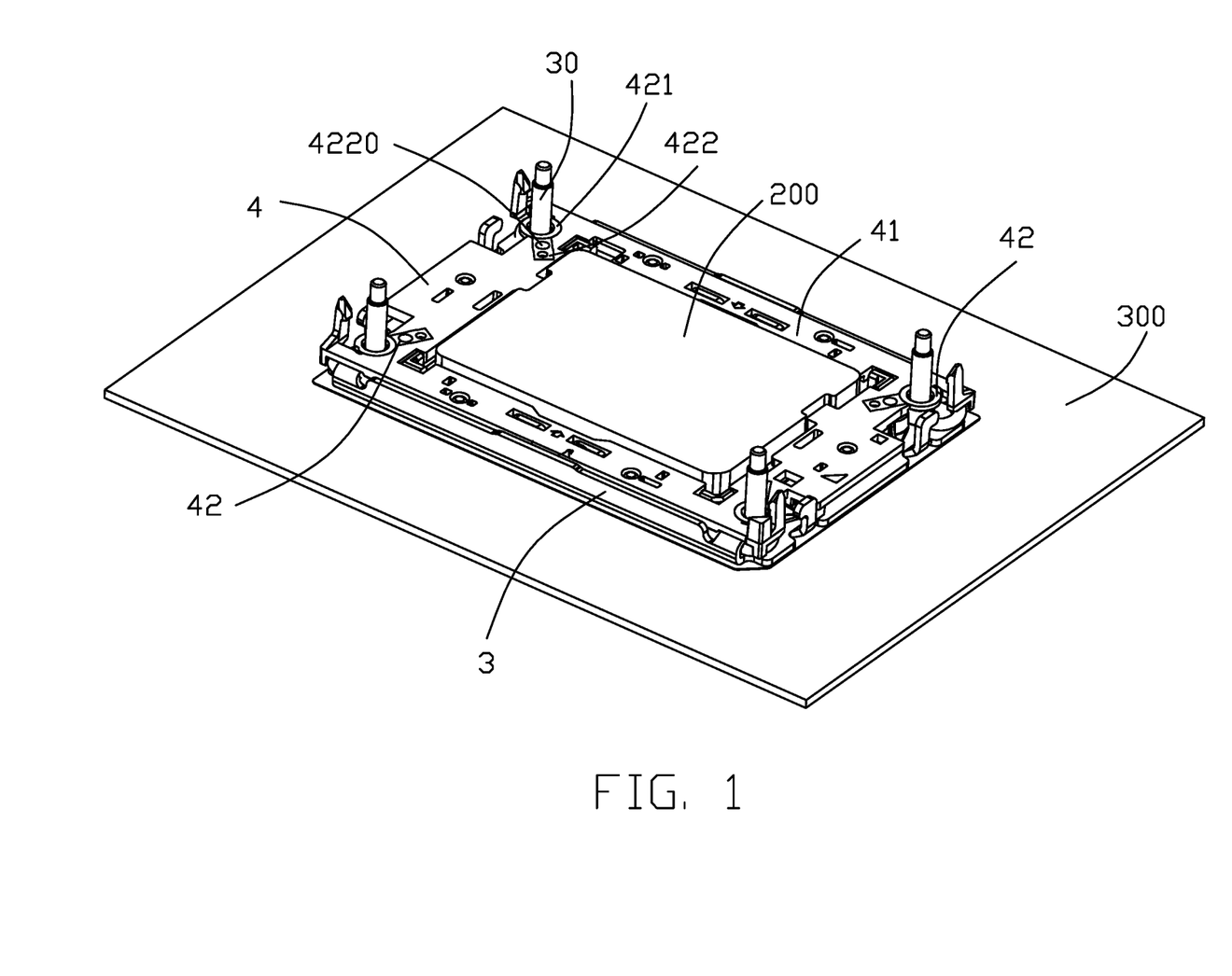
FIG. 1 is a perspective view of an electrical connector assembly according to the invention.
Figure 2:
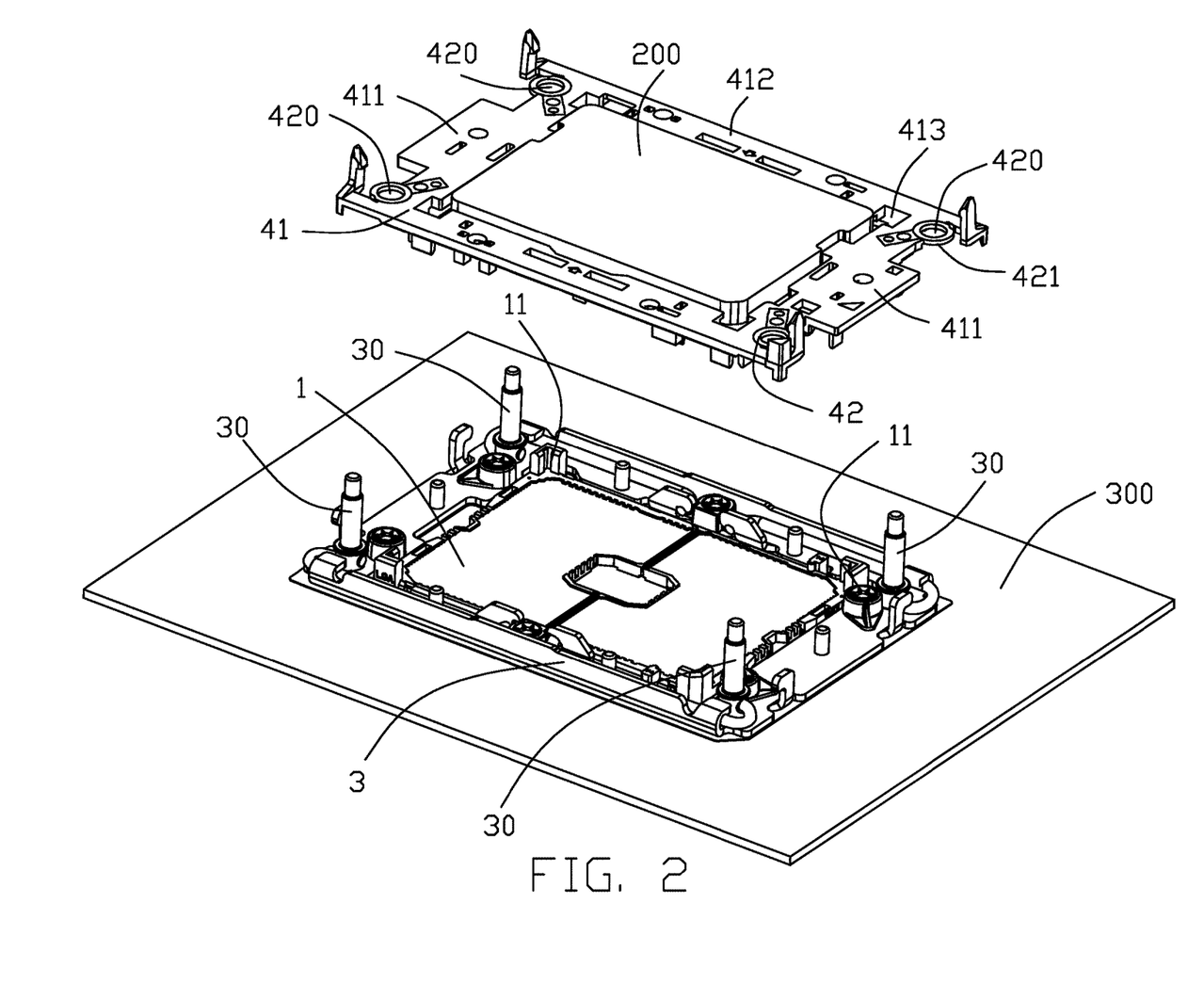
FIG. 2 is an exploded perspective view of the electrical connector assembly of FIG. 1.
Figure 3:
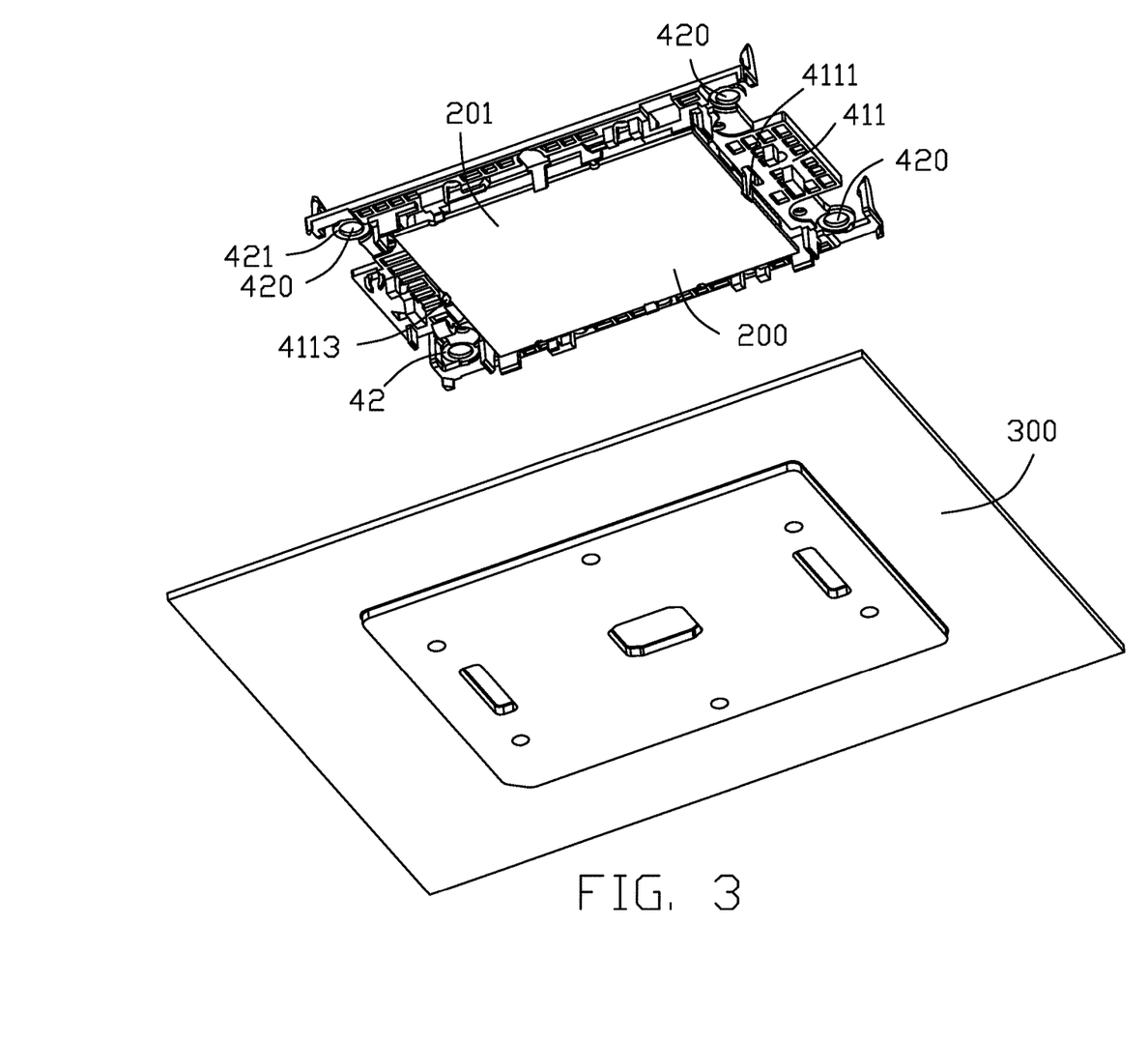
FIG. 3 is another exploded perspective view of the electrical connector assembly of FIG. 2.
Figure 4:
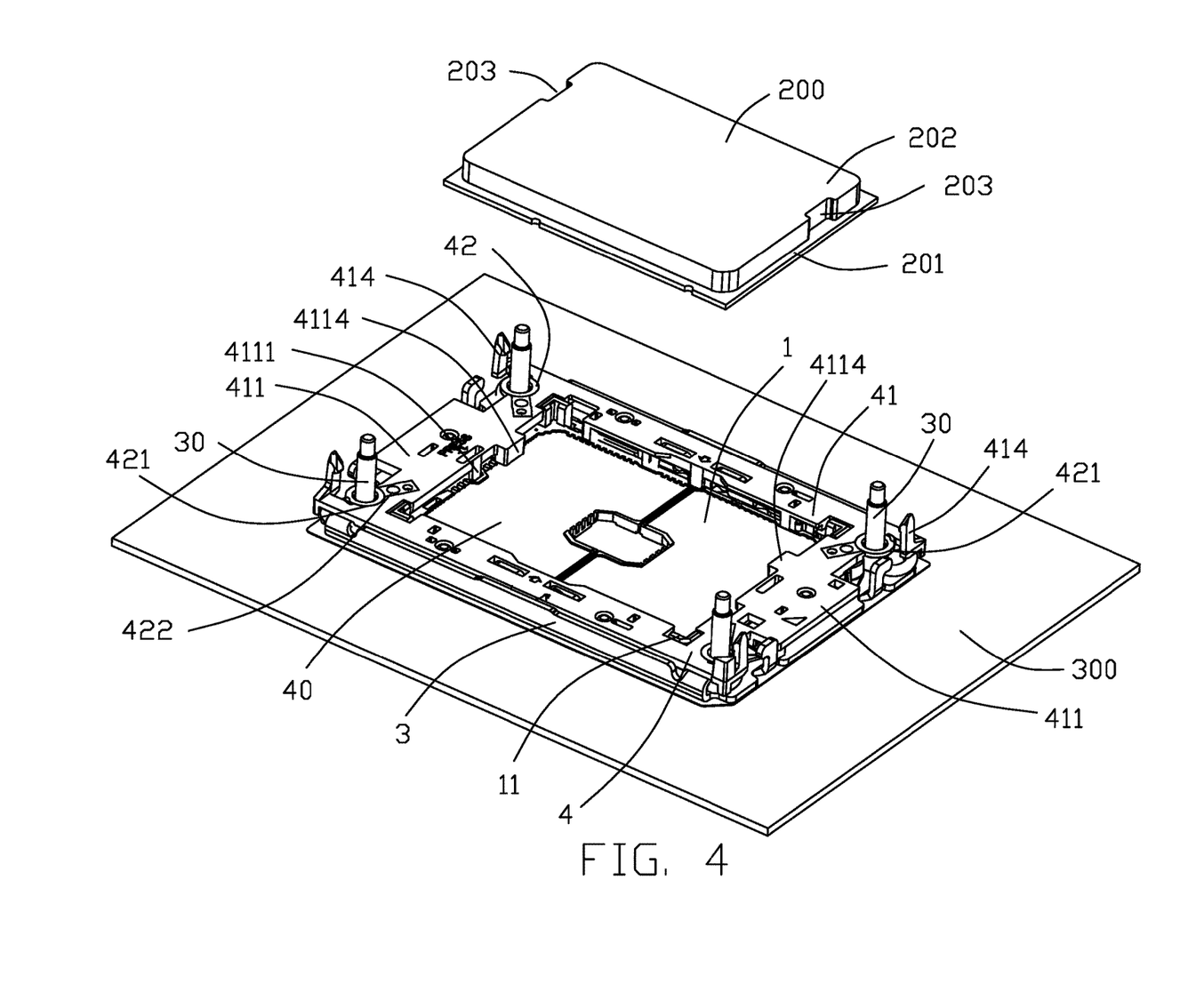
FIG. 4 is another exploded perspective view of the electrical connector assembly of FIG. 1.
Figure 5:
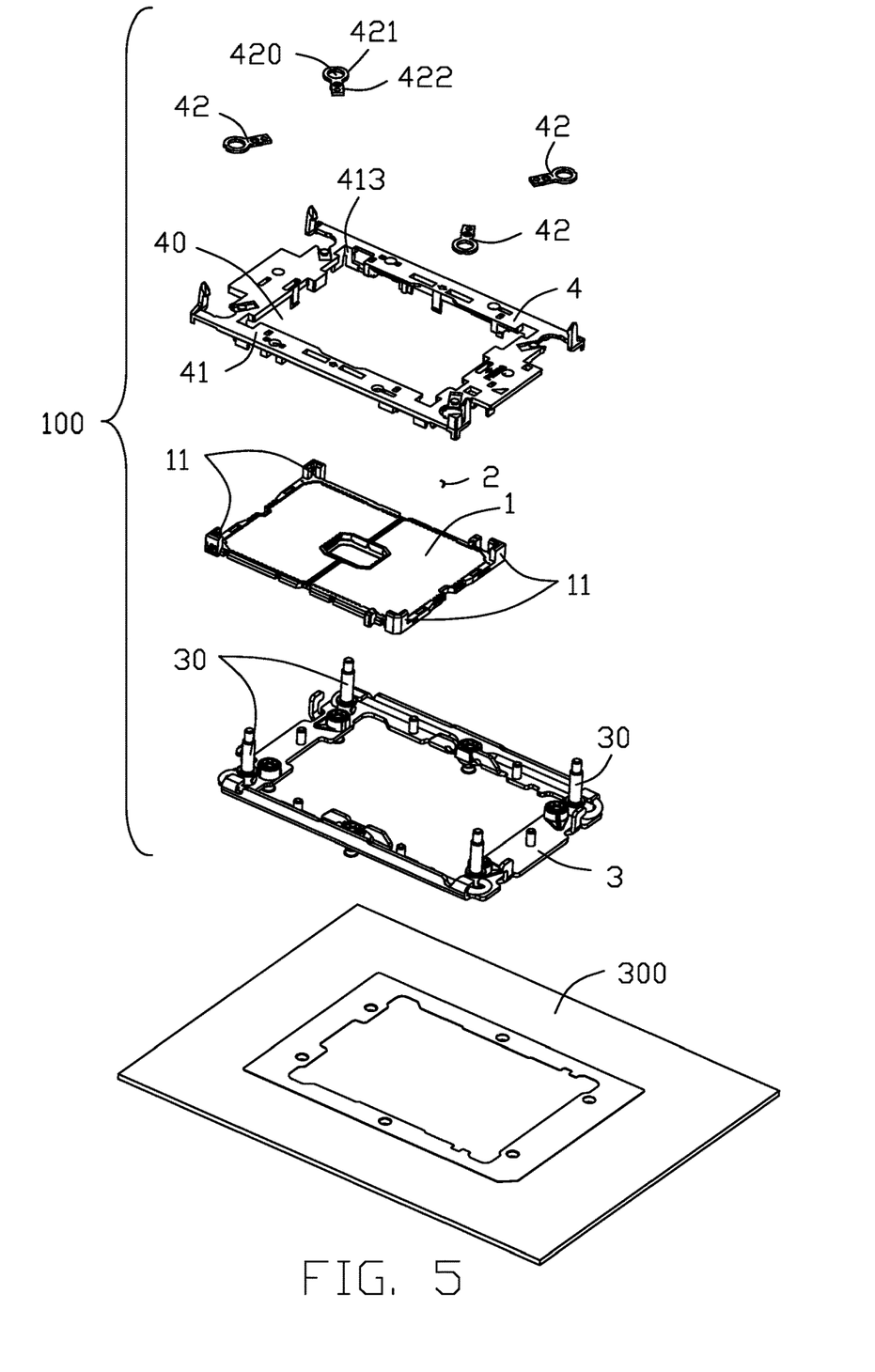
FIG. 5 is a further exploded perspective view of the electrical connector assembly of FIG. 4.
Figure 6:
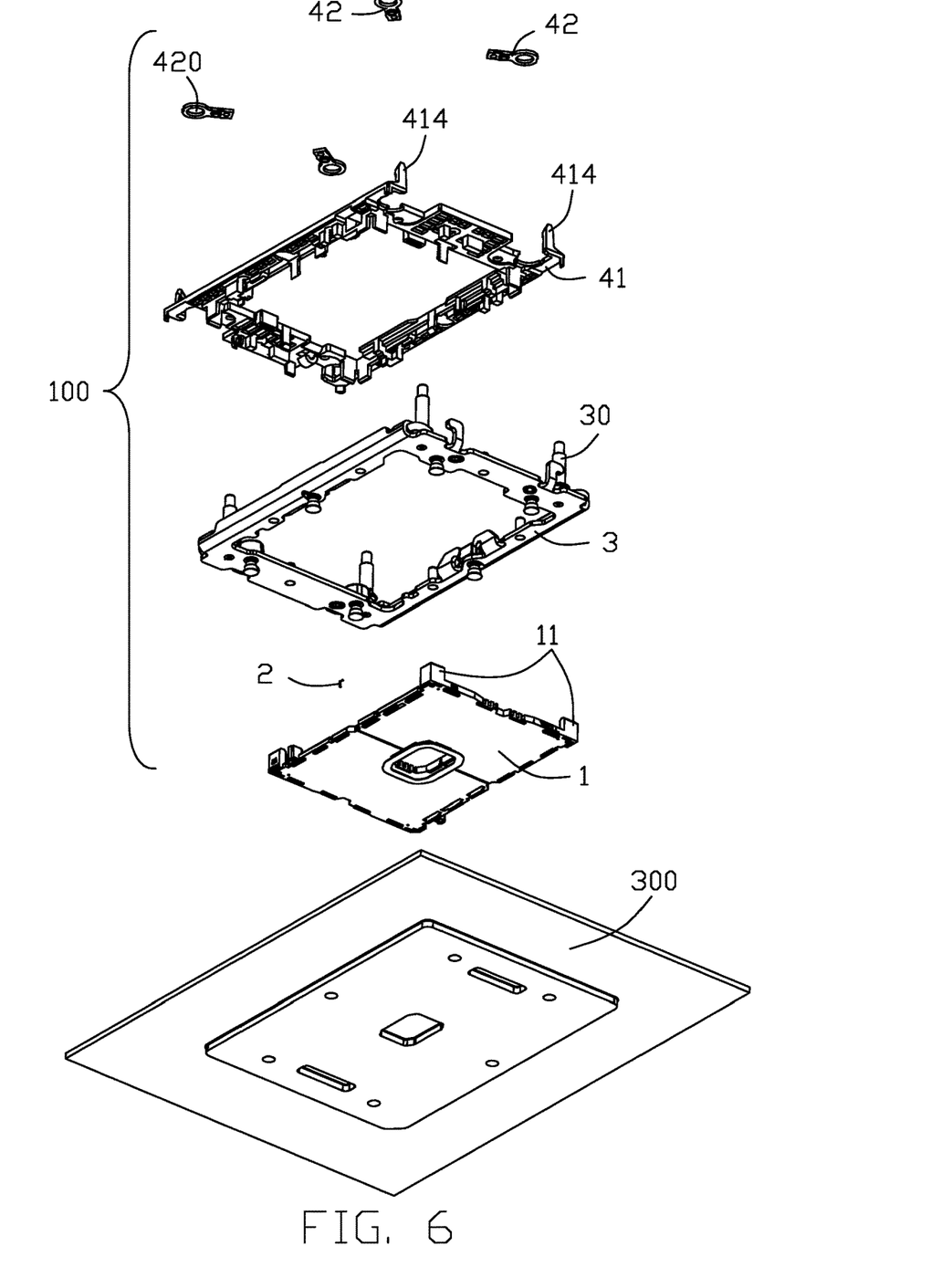
FIG. 6 is another exploded perspective view of the electrical connector assembly of FIG. 5.
Figure 7:
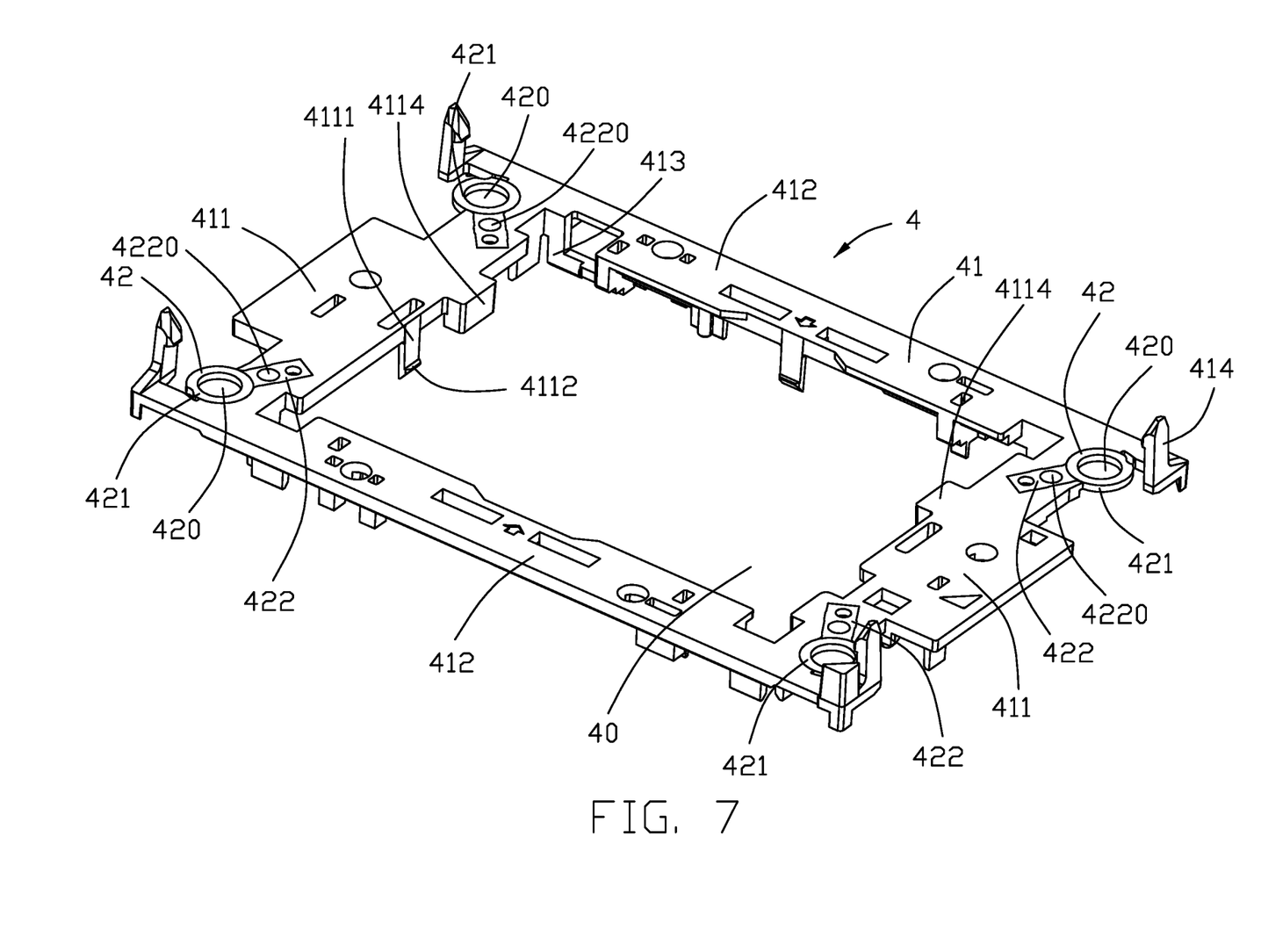
FIG. 7 is a perspective view of the retainer of the electrical connector assembly of FIG. 6.
Figure 8:
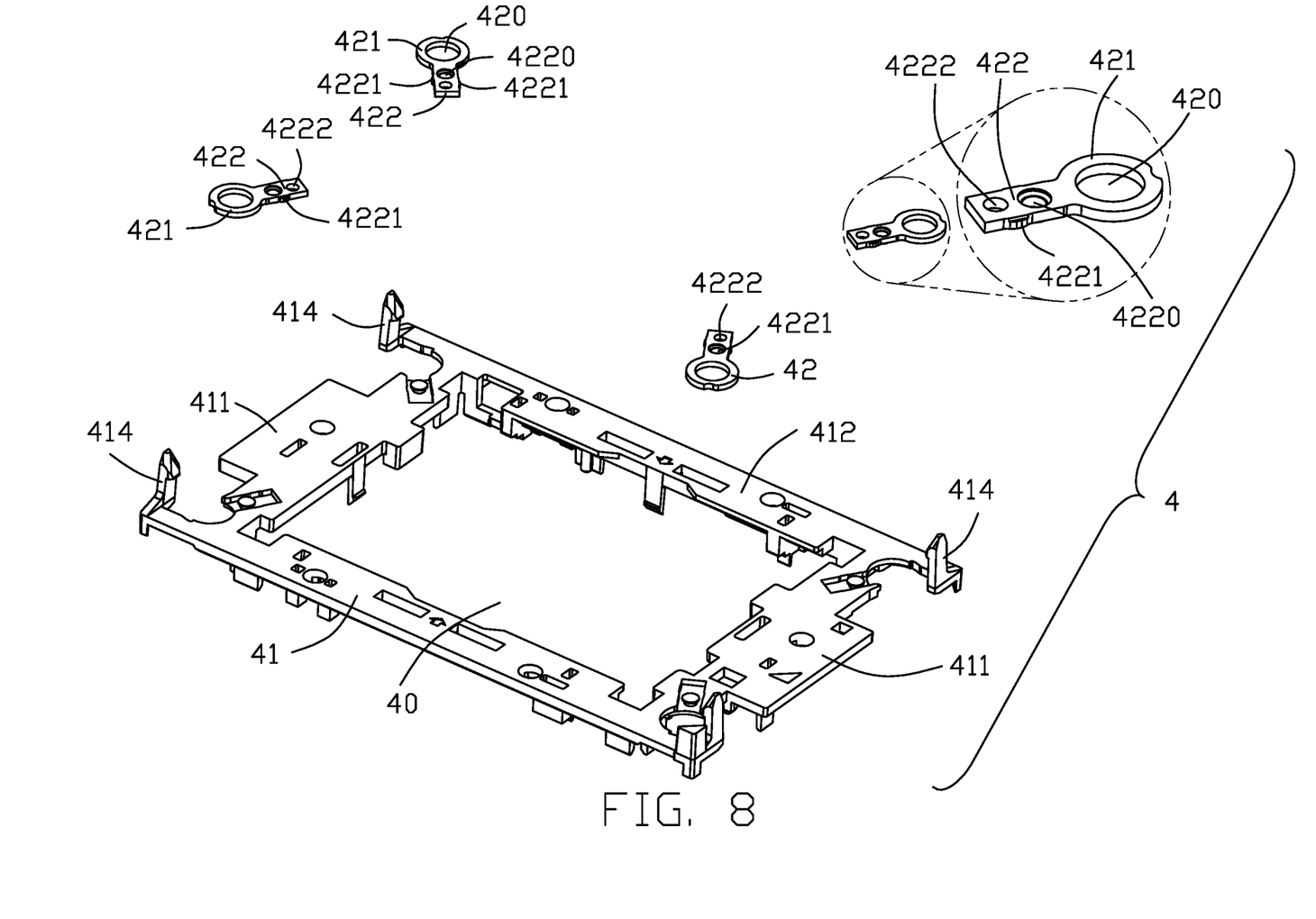
FIG. 8 is an exploded perspective view of the retainer of the electrical connector assembly of FIG. 7.
Figure 9:
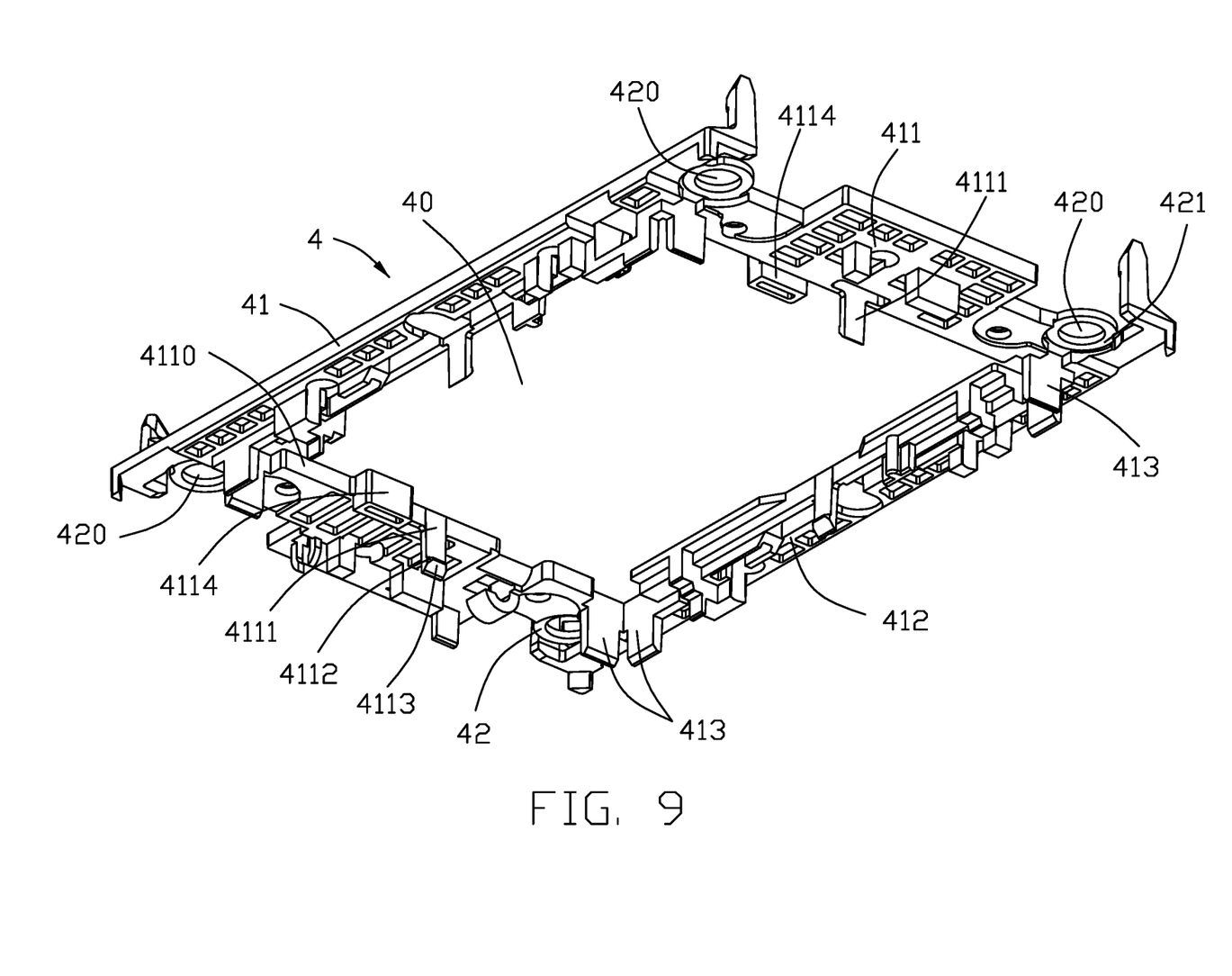
FIG. 9 is another perspective view of the retainer of the electrical connector assembly of FIG. 7.
Figure 10:
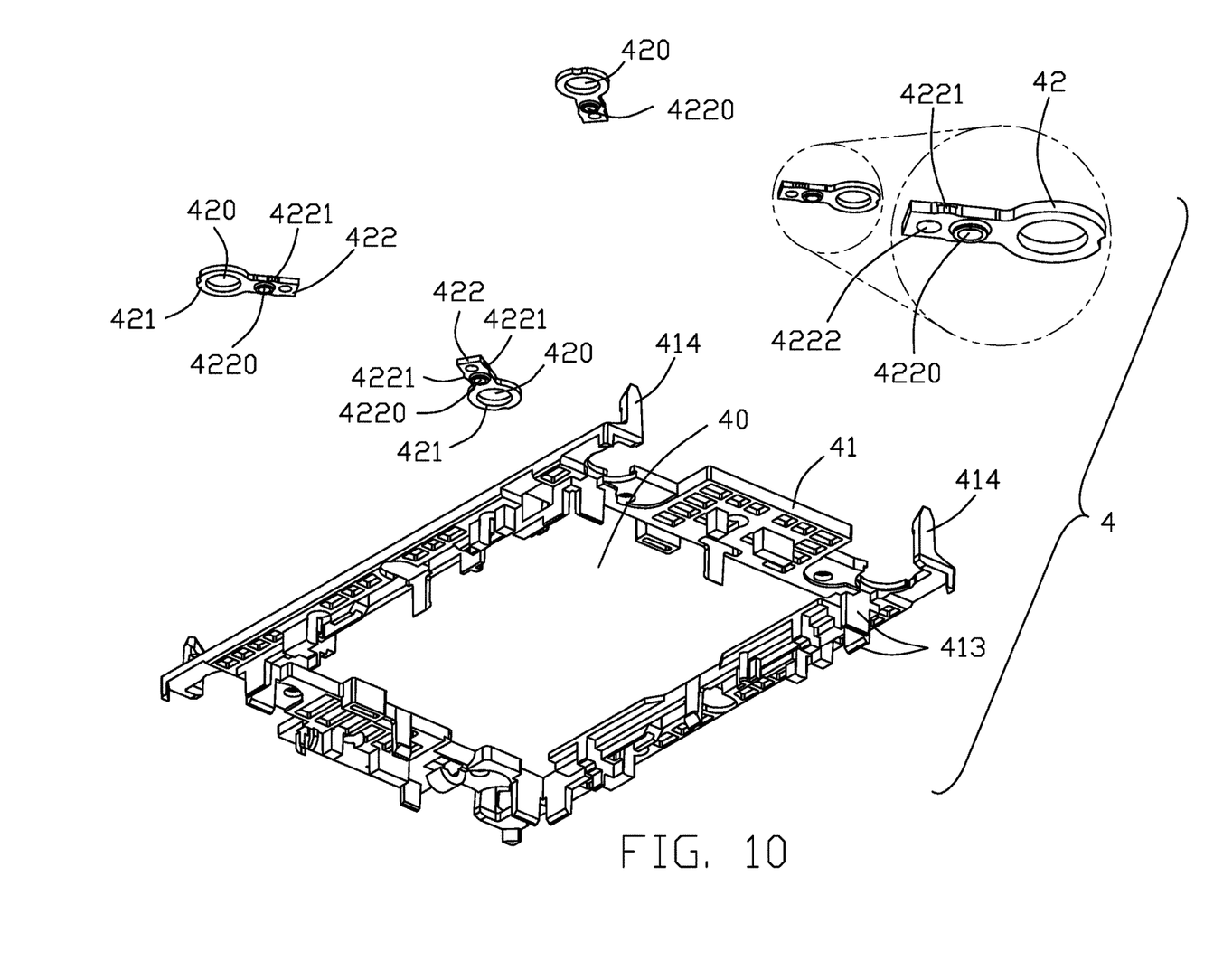
FIG. 10 is another exploded perspective view of the retainer of the electrical connector assembly of FIG. 8.

Each extension 42 further includes a positioning hole 4222 for engagement with a fixing tool (not shown) during the insert-molding process with the frame part 41. Understandably, the insulative material of the frame part 41 may occupy an upper space of the offset rim 4220, the through hole in the offset rim 4220 and under the offset rim 4220 so as to reliably retain the retaining support 42 to the frame part 41. Differently, the positioning hole 4222 is empty after the retainer 4 is completely formed. In addition, in this embodiment, an outer half/part of each ring 41 is laterally exposed to an exterior while an inner part of the ring 41 is adhered to the frame part 41.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly for mounting to a printed circuit board, comprising:
   an insulative housing with a plurality of contacts for receiving an electronic package therein;
   a metallic frame surrounding the housing and equipped with a plurality of upstanding positioning posts at corners;
   an insulative retainer positioning upon both the housing and the metallic frame, and including a frame part with a receiving space for holding said electronic package, and a plurality of metallic retaining supports embedded within corners of the frame part; wherein
   each retaining support includes a ring with a through hole therein to receive the corresponding positioning post therein.

2. The electrical connector assembly as claimed in claim 1, wherein the retainer includes a plurality of latches for upward engagement with the electronic package.

3. The electrical connector assembly as claimed in claim 2, wherein the retainer includes positioning blocks for engagement within corresponding notches of the electronic package.

4. The electrical connector assembly as claimed in claim 1, wherein each retaining support further includes an extension unitarily extending from the ring.

5. The electrical connector assembly as claimed in claim 4, wherein the retaining supports are integrally formed with the frame part via insert-molding, and the extension forms a positioning hole for cooperating with a fixture during insert-molding.

6. The electrical connector assembly as claimed in claim 4, wherein the extension further includes a downward offset rim with a through aperture therein, and material of the frame part occupies the through aperture.

7. The electrical connector assembly as claimed in claim 4, wherein said extension extends horizontally, and perpendicular to an axial direction of the through hole.

8. The electrical connector assembly as claimed in claim 7, wherein said extension extends toward a center region of the receiving space.

9. The electrical connector assembly as claimed in claim 4, wherein a pair of laterally bulged sections are formed on two opposite sides of the extension.

10. The electrical connector assembly as claimed in claim 9, wherein said pair of bulges sections are thinner than the extension and hidden within the frame part in a vertical direction.

11. The electrical connector assembly as claimed in claim 1, wherein the retainer forms a plurality of alignment grooves at said corners thereof to receiving upstanding walls of the housing for alignment between the housing and the retainer in a vertical direction.

12. A retainer for use with an electrical connector assembly having a metallic frame having upstanding positioning posts at corners thereof and surrounding an insulative housing with a plurality of contacts retained therein, comprising:
    an insulative frame part forming a receiving space for receiving an electronic package therein; and
    a plurality of metallic retaining supports integrally formed within corners of the frame part via insert-molding; wherein
    the frame part forms a plurality of latches for holding the electronic package, and each of the retaining supports forms a ring with a through hole for allowing the positioning post to extend therethrough in a vertical direction.

13. The retainer as claimed in claim 12, wherein the frame part further includes a plurality of positioning blocks for engagement within corresponding notches of the electronic package.

14. The retainer as claimed in claim 12, wherein each retaining support further includes an extension unitarily extending from the ring for enhancing retention with the frame part.

15. The retainer as claimed in claim 14, wherein said extension extends in a horizontal direction perpendicular to the vertical direction.

16. The retainer as claimed in claim 15, wherein said extension forms a through positioning hole for cooperation with a fixture during insert-molding.

17. The retainer as claimed in claim 14, wherein said horizontal direction extends a center region of the receiving space.

18. The retainer as claimed in claim 14, wherein both upper and lower surfaces of the ring are exposed to an exterior in the vertical direction while at least one of upper and lower surfaces of the extension is hidden behind the frame part in the vertical direction.

19. A combination comprising:
    a metallic rectangular frame including a plurality of upstanding positioning posts at four corners thereof; and
    an insulative retainer including a rectangular frame part with a receiving space therein for receiving an electronic package, and a plurality of metallic retaining supports integrally formed at four corners of the frame part via insert-molding; wherein
    the retaining support includes a ring with a through hole to receive the corresponding positioning post therein along a vertical direction, and said ring has an outer portion laterally exposed to an exterior and an inner portion adhered to the frame part.

20. The combination as claimed in claim 19, wherein the retaining support further includes an extension unitarily extending from the ring in a horizontal direction perpendicular to the vertical direction.

* * * * *